(12) United States Patent
Lee

(10) Patent No.: US 7,663,194 B2
(45) Date of Patent: Feb. 16, 2010

(54) CMOS IMAGE SENSOR

(76) Inventor: Nan-Yi Lee, 1 Hyangjeong-dong, Heungduk-gu, Cheongju-si, Chungcheongbuk-do, 361-725 (KR)

( * ) Notice: Subject to any disclaimer, the term of this patent is extended or adjusted under 35 U.S.C. 154(b) by 201 days.

(21) Appl. No.: 11/643,368

(22) Filed: Dec. 20, 2006

(65) Prior Publication Data

US 2007/0269944 A1  Nov. 22, 2007

Related U.S. Application Data

(62) Division of application No. 11/126,861, filed on May 10, 2005, now abandoned.

(51) Int. Cl.
*H01L 29/72* (2006.01)

(52) U.S. Cl. .................. 257/401; 257/231; 257/241; 257/443; 257/465; 257/618; 257/773

(58) Field of Classification Search ............. 257/231, 257/241, 401, 443, 465, 618, 773
See application file for complete search history.

(56) References Cited

U.S. PATENT DOCUMENTS 7,030,357 B2 * 4/2006 Lee ..................... 250/208.1

2004/0113151 A1 * 6/2004 Sekine ..................... 257/72
2006/0146158 A1  7/2006 Toros et al. ............. 348/308

OTHER PUBLICATIONS

U.S. Appl. No. 11/126,861, filed May 10, 2005.

* cited by examiner

*Primary Examiner*—Edward Wojciechowicz
(74) *Attorney, Agent, or Firm*—McAndrews, Held & Malloy, Ltd.

(57) ABSTRACT

A pixel of a complementary metal oxide semiconductor (CMOS) image sensor includes a plurality of photodiodes for sensing light to thereby generate photoelectric charges in different regions; a plurality of transfer transistors for transferring photoelectric charges of corresponding photodiodes in response to a first control signal; a floating diffusion region for receiving photoelectric charges transferred by the plurality of transfer transistors; a rest transistor connected between a power supply voltage and the floating diffusion region for resetting the floating diffusion region by controlling a voltage loaded on the floating diffusion region in response to a second control signal; a drive transistor connected between the power supply voltage and the floating diffusion region to serve as a source follower buffer amplifier; and a select transistor connected between the drive transistor and a pixel output terminal for performing an addressing operation in response to a third control signal.

6 Claims, 4 Drawing Sheets

CMOS IMAGE SENSOR

The present patent application is a Divisional of application Ser. No. 11/126,861, filed May 10, 2005 now abandoned.

FIELD OF INVENTION

The present invention relates to a complementary metal oxide semiconductor (CMOS) image sensor; and, more particularly, to a CMOS image sensor for improving a light sensing ability by increasing a photodiode region included in a pixel with a reduced pixel size.

DESCRIPTION OF PRIOR ART

Generally, an image sensor is a semiconductor device for converting an optical image into an electrical signal. Charge coupled device (CCD) is a kind of the image sensor.

However, the CCD has several problems. For instance, a power consumption of the CCD is high and an operating method of the CCD is complex. Further, a manufacturing process for manufacturing the CCD is complicated since the manufacturing process includes many masking process steps, and it is hard to integrate a signal processing chip into the CCD.

Therefore, a complementary metal oxide semiconductor (CMOS) image sensor has been developed for overcoming the above-mentioned problems of the CCD.

In case of the CMOS image sensor, an image is generated by detecting data outputted from unit pixels included in the CMOS image sensor in sequence through a switching operation. Each unit pixel included in the CMOS image sensor includes a photodiode and MOS transistors.

Since the CMOS image sensor is manufactured by using a CMOS manufacturing technology, a power consumption of the CMOS image sensor is low and a manufacturing process of the CMOS image sensor having about 20 masking process steps is simpler than that of the CCD having about 30 to 40 masking process steps. Further, it is easy to integrate the CMOS image sensor into another signal processing chip.

FIG. 1A is a schematic circuit diagram depicting a unit pixel included in a conventional CMOS image sensor.

As shown, the unit pixel includes a photodiode PD 100, a transfer transistor Tx 101, a reset transistor Rx 103, a drive transistor Dx 104, and a select transistor Sx 105.

The photodiode PD 100 senses light to generate a photoelectric charge. The transfer transistor Tx 101 transfers the photoelectric charge generated by the photodiode PD 100 to a floating diffusion region FD 102. The reset transistor Rx 103 controls a voltage loaded on the floating diffusion region FD 102 to thereby reset the floating diffusion region FD 102.

The drive transistor Dx 104 is operated as a source follower buffer amplifier and the select transistor Sx 105 is operated as a switch to perform an addressing operation.

A load transistor 106 is formed outside the unit pixel to thereby read an output signal.

FIG. 1B is a diagram showing a layout of a photodiode and MOS transistors included in the unit pixel shown in FIG. 1.

As shown, an isolation region for forming an active region and a gate conductive layer is formed, wherein a photodiode 100 and a diffusion region 102 are formed in the active region and each gate of the MOS transistors is formed in the gate conductive layer. The photodiode 100 is shaped as a square and a gate of a transfer transistor 101 is connected to one side of the photodiode 100.

The floating diffusion region 102 is connected to one side of the gate of the transfer transistor 101. The floating diffusion region 102 is bended from a Y-axis direction to an X-axis direction to be connected to one side of a gate of a reset transistor 103.

The other side of the gate of the reset transistor 103 is connected to a drain region 107. The drain region 107 is bended from an X-axis direction to a Y-axis direction to be connected to one side of a gate of a drive transistor 104.

A source/drain region 108 is formed between the other side of the gate of the drive transistor 104 and one side of a gate of a select transistor 105. Another source drain/drain region 109 is formed to the other side of the gate of the select transistor 105.

The floating diffusion region 102 is formed on an active region between each gate of the transfer transistor 101 and the reset transistor 103. The floating diffusion region 102 is electrically connected to the gate of the drive transistor 104 through a contact and a connect wire.

Operations of the conventional CMOS image sensor are described below.

(a) The photodiode PD is reset by turning on the transfer transistor Tx and the reset transistor Rx.

(b) The transfer transistor Tx, the reset transistor Rx and the select transistor Sx are turned off. Herein, the photodiode is in a fully depletion state.

(c) A photoelectric charge is integrated into the photodiode PD.

(d) The floating region FD is reset by turning on the reset transistor Rx after an appropriate integration time is passed.

(e) A required unit pixel is addressed by turning on the select transistor Sx.

(f) A first output voltage V1 outputted from the drive transistor Dx is measured, wherein the output voltage V1 indicates a direct current (DC) level shift of the floating diffusion region FD.

(g) The transfer transistor Tx is turned on. Herein, all the photoelectric charges integrated in the photodiode PD is transferred to the floating diffusion region FD.

(h) The transfer transistor Tx is turned off.

(i) A second output voltage V2 outputted from the drive transistor Dx is measured.

(j) A voltage difference between the first output voltage V1 and the second output voltage V2 is generated. The output signal (V1-V2) is generated as a result of the transference of the photoelectric charges and is a pure image signal value not having a noise.

The first output voltage V1 includes a noise and the second output voltage V2 includes both of a noise and an image signal. Thus, the pure image signal is obtained by subtracting the first output voltage V1 from the second output voltage V2. This method is generally called a correlated double sampling (CDS). The CDS is generally applied to the conventional CMOS image sensor.

Meanwhile, enough unit pixels are required to be included in the conventional CMOS image sensor and a photodiode included in each unit pixel requires an enough region.

However, as above-mentioned, since a unit pixel included in the conventional CMOS image sensor includes a photodiode and four MOS transistors, it is hard to reduce a size of the conventional CMOS image sensor satisfying the enough number of unit pixels and the enough region of a photodiode.

SUMMARY OF INVENTION

It is, therefore, an object of the present invention to provide a complementary metal oxide semiconductor (CMOS) image sensor capable of securing enough number of unit pixels and an enough photodiode region with a reduced size.

In accordance with an aspect of the present invention, there is provided a pixel of a CMOS image sensor including a plurality of photodiodes for sensing light to thereby generate photoelectric charges in different regions; a plurality of transfer transistors for transferring photoelectric charges of corresponding photodiodes in response to a first control signal; a floating diffusion region for receiving photoelectric charges transferred by the plurality of transfer transistors; a rest transistor connected between a power supply voltage and the floating diffusion region for resetting the floating diffusion region by controlling a voltage loaded on the floating diffusion region in response to a second control signal; a drive transistor connected between the power supply voltage and the floating diffusion region to serve as a source follower buffer amplifier; and a select transistor connected between the drive transistor and a pixel output terminal for performing an addressing operation in response to a third control signal.

BRIEF DESCRIPTION OF THE INVENTION

The above and other objects and features of the present invention will become apparent from the following description of preferred embodiments taken in conjunction with the accompanying drawings, in which.

DETAILED DESCRIPTION OF INVENTION

Hereinafter, a complementary metal oxide semiconductor (CMOS) image sensor in accordance with the present invention will be described in detail referring to the accompanying drawings.

Figure 1A:
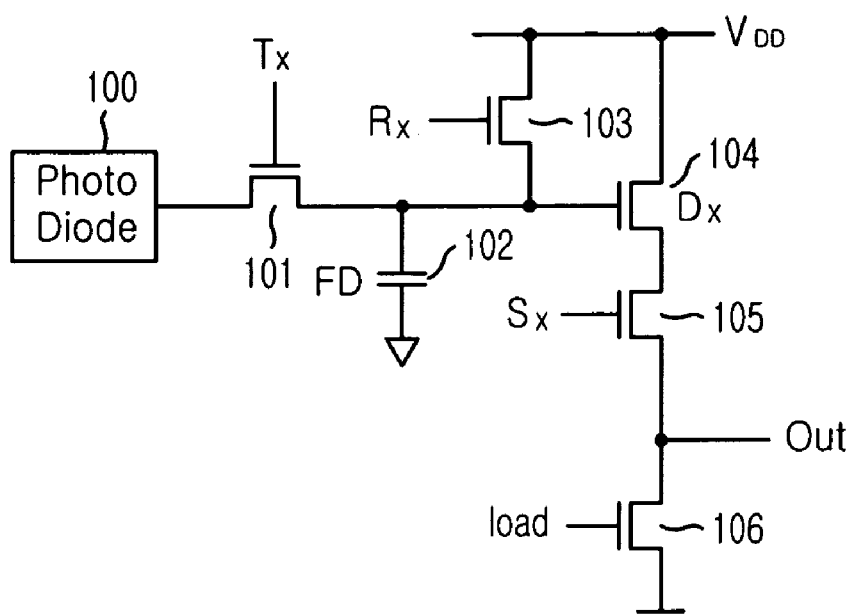
FIG. 1A is a schematic circuit diagram depicting a unit pixel included in a conventional CMOS image sensor.
Figure 1B:
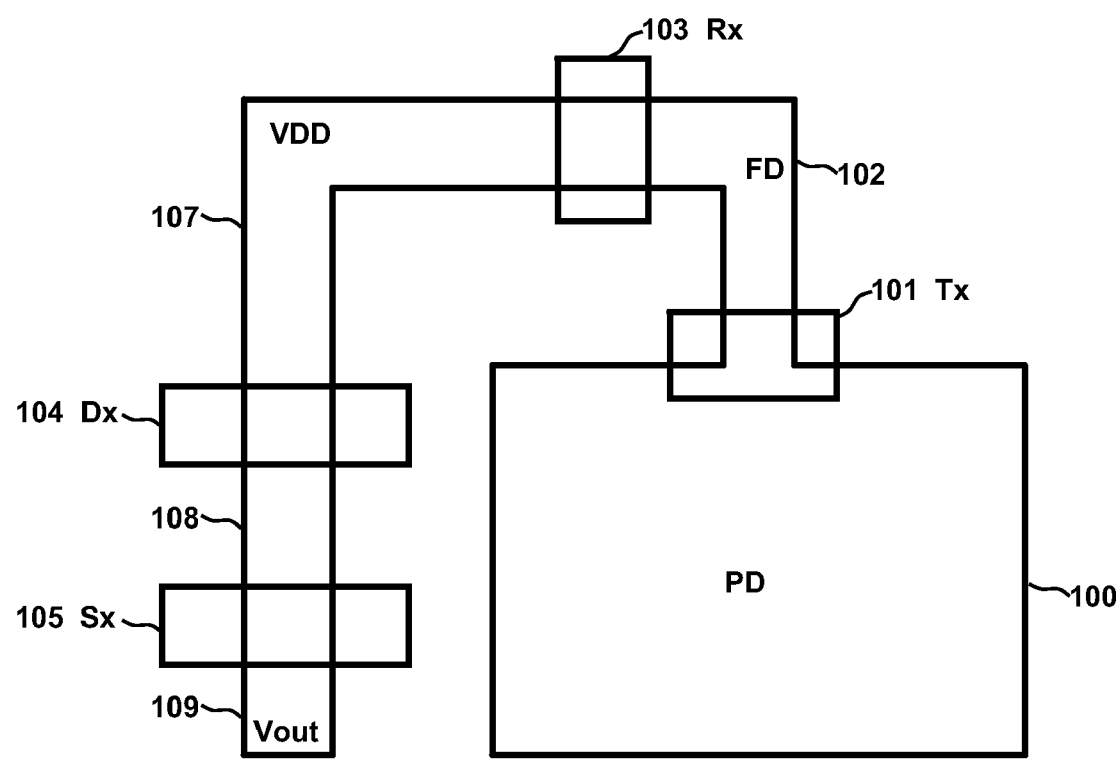
FIG. 1B is a diagram showing a layout of a photodiode and MOS transistors included in the unit pixel shown in FIG. 1.
Figure 2A:
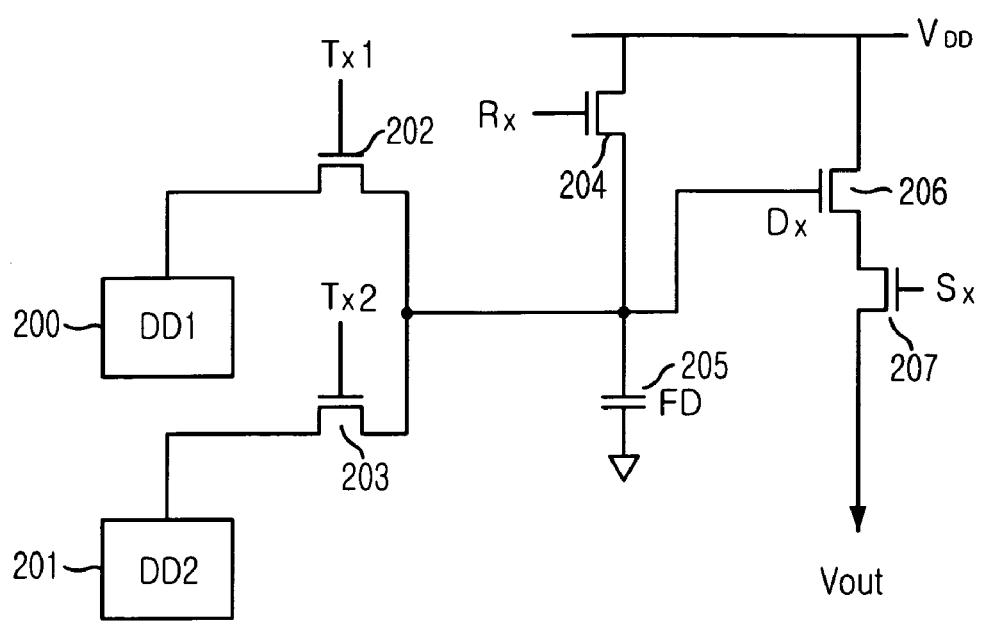
FIG. 2A is a schematic circuit diagram showing a pixel structure of a CMOS image sensor in accordance with a preferred embodiment of the present invention.

FIG. 2A is a schematic circuit diagram showing a pixel structure of a CMOS image sensor in accordance with a preferred embodiment of the present invention.

As shown, two photodiodes, i.e., a first photo diode PD1 and a second photodiode PD2, share a floating diffusion region FD, a reset transistor Rx, a drive transistor Dx and a select transistor Sx. That is, a unit pixel serves as two pixels.

Referring to FIG. 2A, the CMOS image sensor includes a first photodiode 200, a second photodiode 201, a first transfer transistor 202, a second transfer transistor 203, a reset transistor 204, a floating diffusion region 205, a drive transistor 206 and a select transistor 207.

The first and the second photodiodes 200 and 201 sense light to thereby generate photoelectric charges in different regions. The first transfer transistor 202 transfers photoelectric charges generated by the first photodiode 200 in response to a first transferring control signal Tx1. Likewise, the second transfer transistor 203 transfers photoelectric charges generated by the second photodiode 201 in response to a second transferring control signal Tx2.

The floating diffusion region 205 receives the photoelectric charges transferred by the first and the second transfer transistors 202 and 203.

The reset transistor 204 controls a voltage loaded on the floating diffusion region 205 to thereby reset the floating diffusion region 205. Herein, a drain of the reset transistor 204 is coupled to a power supply voltage VDD and a source of the reset transistor 204 is connected to the floating diffusion region 205.

The drive transistor 205 serves as a source follower buffer amplifier. Herein, a source of the drive transistor 205 is coupled to the power supply voltage VDD and a gate of the drive transistor 205 is connected to the floating diffusion region 205.

The select transistor 207 is connected between the drive transistor 206 and a pixel output terminal Vout. The select transistor 207 is operated as a switch to perform an addressing operation in response to a select control signal Sx.

Operations of the above-mentioned CMOS image sensor are described below.

(1) The first and the second photodiodes 200 and 201 are reset by turning on the first and the second transfer transistors 202 and 203 respectively.

(2) The first transfer transistor 202, the second transfer transistor 203, the reset transistor 204 and select transistor 207 are turned off. Herein, the first and the second photodiodes 200 and 201 are in a fully depletion state.

(3) Photoelectric charges are integrated into the first and the second photodiodes 200 and 201.

(4) The floating region 205 is reset by turning on the reset transistor 204 after an appropriate integration time is passed.

(5) A required unit pixel is addressed by turning on the select transistor 207.

(6) A first output voltage V1 outputted from the drive transistor 206 is measured, wherein the output voltage V1 indicates a direct current (DC) level shift of the floating diffusion region 205.

(7) The first transfer transistor 202 is turned on. Herein, all the photoelectric charges integrated in the first photodiode 200 are transferred to the floating diffusion region 205.

(8) The first transfer transistor 202 is turned off.

(9) A second output voltage V2 outputted from the drive transistor 206 is measured.

(10) A voltage difference between the first output voltage V1 and the second output voltage V2 is generated. The output signal (V1-V2) is a pure image signal value generated from photoelectric charges integrated in the first photodiode 200.

(11) The floating diffusion region 205 is reset by turning on the reset transistor 204.

(12) The required unit pixel is addressed by turning on the select transistor 207.

(13) A third output voltage V3 outputted from the drive transistor 206 is measured.

(14) The second transfer transistor 203 is turned on. Herein, all the photoelectric charges integrated in the second photodiode 201 are transferred to the floating diffusion region 205.

(15) The second transfer transistor 203 is turned off.

(16) The fourth output voltage V4 outputted from the drive transistor 206 is measured.

(17) A voltage difference between the third output voltage V3 and the fourth output voltage V4 is generated. The output signal (V3-V4) is a pure image signal value generated from photoelectric charges integrated in the second photodiode 201.

Figure 2B:
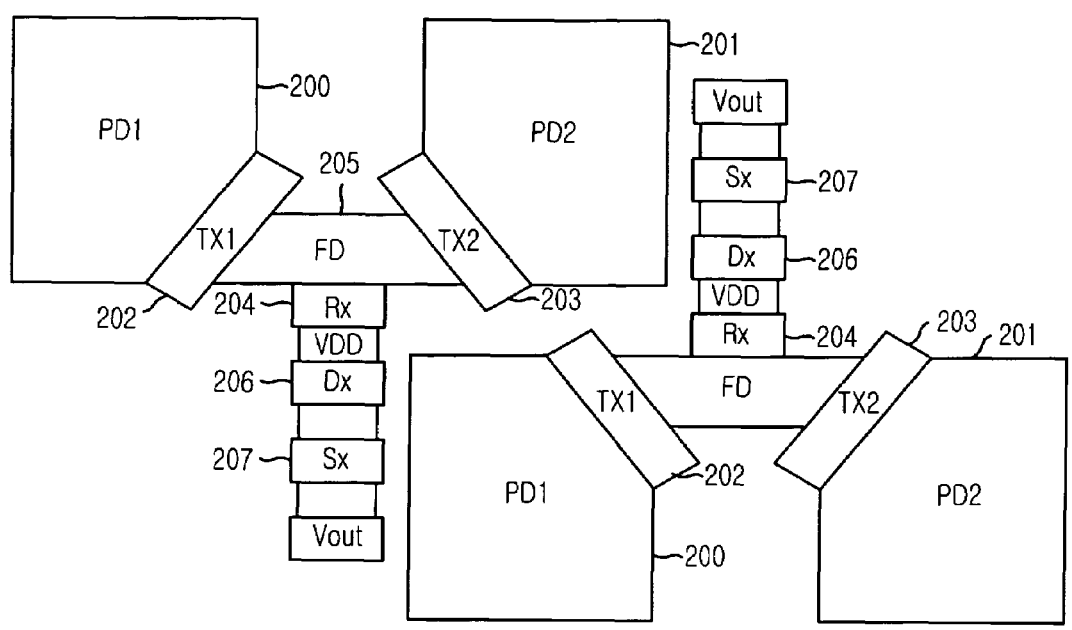
FIG. 2B is a diagram showing a layout of unit pixels in accordance with the preferred embodiment of the present invention.

FIG. 2B is a diagram showing a layout of two unit pixels in accordance with the preferred embodiment of the present invention.

As shown, an active region for forming a photodiode and diffusion region of each MOS transistors is laid out as a "T" shape. The first and the second photodiodes 200 and 201 are separately formed on an active region of a head of the "T" shape.

On the lower active region of the "T" shape, the floating diffusion region 205, the reset transistor 204, the drive transistor 206 and the select transistor 207 are formed.

On an edge portion of the first photodiode 200, the first transfer transistor 202 is formed. Likewise, on an edge portion of the second photodiode 201, the second transfer transistor 203 is formed.

Meanwhile, unit pixels are laid out such that one unit pixel is formed upside down in comparison with a neighboring unit pixel so that the unit pixels engage each other as shown in FIG. 2B. Therefore, a size of the CMOS image sensor can be reduced.

Although the above-mentioned embodiment of the present invention describes a unit pixel including four transistors, i.e., a transfer transistor, a reset transistor, a drive transistor and a select transistor, the present invention can be applied to another unit pixel including a photodiode, a floating diffusion region and a transfer gate formed between the photodiode and the floating diffusion region. That is, the present invention can be applied to any image sensor, wherein a plurality of photodiode share one floating diffusion region through corresponding transfer transistors.

Therefore, in accordance with the present invention, since a plurality of photodiodes share one floating diffusion region, the number of reset transistors, drive transistors, and select transistors can be reduced. Accordingly, a size of an image sensor can be reduced and the number of dies per one wafer can be increased.

Further, a fixed pattern noise can be eliminated because of the reduction of the number of MOS transistors and the sharing method. Also, a light sensing ability is increased since enough area for a photodiode region can be secured.

While the present invention has been described with respect to the particular embodiments, it will be apparent to those skilled in the art that various changes and modifications may be made without departing from the spirit and scope of the invention as defined in the following claims.

What is claimed is:

1. A pixel layout of a CMOS image sensor for arranging a pixel comprising:
   two photodiodes;
   a floating diffusion region shared by the two photodiodes;
   two transfer transistors, each diagonally disposed between two photodiodes and the floating diffusion region, wherein each of the photodiodes and transfer transistors are symmetrical with respect to the floating diffusion region; and
   a reset transistor, a drive transistor and a select transistor disposed in straight alignment with the floating diffusion region.

2. The pixel layout as recited in claim 1, wherein unit pixels are laid out such that one unit pixel is formed upside down in comparison with a neighboring unit pixel so that the unit pixels are engaged with each other.

3. The pixel layout as recited in claim 1, wherein said image sensor comprises:
   a plurality of photodiodes for sensing light to thereby generate photoelectric charges;
   a plurality of transfer transistors for transferring photoelectric charges of corresponding photodiodes in response to a first control signal;
   a floating diffusion region for receiving photoelectric charges transferred by the plurality of transfer transistors;
   a reset transistor connected between a power supply voltage and the floating diffusion region for resetting the floating diffusion region by controlling a voltage loaded on the floating diffusion region in response to a second control signal;
   a drive transistor connected between the power supply voltage and the floating diffusion region to serve as a source follower buffer amplifier; and
   a select transistor connected between the drive transistor and a pixel output terminal for performing an addressing operation in response to a third control signal.

4. The pixel layout as recited in claim 1, further comprising:
   an active region for forming source/drain regions, the two photodiodes, and the floating diffusion region between gate patterns of each transistor in a substrate, wherein the active region includes a first active region having a "U" shape and a second active region having an "I" shape.

5. The pixel layout as recited in claim 4, wherein the floating diffusion region is are formed between two photodiodes in the first active region, and two gate patterns of the transfer transistors are disposed between the two photodiodes and the floating diffusion in the first active region.

6. The pixel layout as recited in claim 4, wherein
   the gate patterns of the reset transistor, the drive transistor, the select transistor are formed on the second active region, and
   the source/drain regions therebetween are formed in the second active region.

* * * * *

UNITED STATES PATENT AND TRADEMARK OFFICE
CERTIFICATE OF CORRECTION

PATENT NO. : 7,663,194 B2  Page 1 of 1
APPLICATION NO. : 11/643368
DATED : February 16, 2010
INVENTOR(S) : Nan-Yi Lee It is certified that error appears in the above-identified patent and that said Letters Patent is hereby corrected as shown below:

Column 6, line 33, after "substrate", delete "wherein";

Column 6, line 34, before "the active", insert --wherein--;

Column 6, line 38, after "is", delete "are".

Signed and Sealed this

Ninth Day of November, 2010

David J. Kappos
*Director of the United States Patent and Trademark Office*